US012777626B2

(12) United States Patent
Dong et al.

(10) Patent No.: US 12,777,626 B2
(45) Date of Patent: Oct. 27, 2026

(54) BUILDING CONTROLLER WITH LATERAL SIDE SHIELDING

(71) Applicant: HONEYWELL INTERNATIONAL INC., Charlotte, NC (US)

(72) Inventors: Baofeng Dong, Charlotte, NC (US); Chao Chen, Charlotte, NC (US); Zhongwei Zhu, Charlotte, NC (US); Ke Wei Han, Charlotte, NC (US); Hua Tang, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 340 days.

(21) Appl. No.: 18/556,598

(22) PCT Filed: Apr. 26, 2021

(86) PCT No.: PCT/CN2021/089750
§ 371 (c)(1),
(2) Date: Oct. 20, 2023

(87) PCT Pub. No.: WO2022/226711
PCT Pub. Date: Nov. 3, 2022

(65) Prior Publication Data
US 2024/0188262 A1 Jun. 6, 2024

(51) Int. Cl.

| | |
|---|---|
| ***H05K 9/00*** | (2006.01) |
| ***F24F 11/50*** | (2018.01) |
| ***H01Q 1/52*** | (2006.01) |

(52) U.S. Cl.
CPC ............ *H05K 9/0022* (2013.01); *F24F 11/50* (2018.01); *H01Q 1/526* (2013.01)

(58) Field of Classification Search
CPC ........ H05K 9/0022; F24F 11/50; H01Q 1/526
(Continued)

(56) References Cited

U.S. PATENT DOCUMENTS

| | | |
|---|---|---|
| 5,777,856 A | 7/1998 | Phillips et al. |
| 6,624,432 B1 | 9/2003 | Gabower et al. |

(Continued)

FOREIGN PATENT DOCUMENTS

| | | |
|---|---|---|
| CN | 1409942 A | 4/2003 |
| CN | 101083897 A | 12/2007 |

(Continued)

OTHER PUBLICATIONS

Chomerics "EMI Shielding Theory & Gasket Design Guide," 30 pages, 2023.

(Continued)

*Primary Examiner* — Hung S. Bui
(74) *Attorney, Agent, or Firm* — Seager, Tufte & Wickhem, LLP

(57) ABSTRACT

A thermostat includes a display having a metal backing, a printed circuit board having a ground plane, and one or more electrical components mounted to the printed circuit board in a shielded region on the printed circuit board between the ground plane and the metal backing. One or more conductive side shield elements are positioned between the printed circuit board and the display, extending along and defining
(Continued)

the shielded region of the printed circuit board. The one or more conductive side shield elements are electrically connected to the ground plane of the printed circuit board and provide a side shield that reduces Electro-Magnetic Interference (EMI) generated by the one or more electrical components situated in the shielded region of the printed circuit board from escaping laterally out from between the ground plane of the printed circuit board and the metal backing of the display.

20 Claims, 8 Drawing Sheets

(58) Field of Classification Search
USPC ........................................ 361/799, 816, 818
See application file for complete search history.

(56) References Cited

U.S. PATENT DOCUMENTS 9,964,326 B2 5/2018 Khoury et al.
2016/0006184 A1* 1/2016 Zhao .................. H01R 13/6598 439/607.3
2016/0218762 A1* 7/2016 Tian ....................... H04B 1/385
2018/0023839 A1* 1/2018 Adamik ............... H05K 7/1422 236/94
2020/0344924 A1* 10/2020 Harrigan ................ H05K 1/144
2021/0392739 A1* 12/2021 Hong .................. H04M 1/0277
2022/0007513 A1* 1/2022 Li ............................. G09F 9/00

FOREIGN PATENT DOCUMENTS

CN 201197258 Y 2/2009
CN 102821537 A 12/2012
CN 103907404 A 7/2014
CN 205902322 U 1/2017
WO 0128305 A1 4/2001
WO 2008085929 A2 7/2008
WO 2013066751 A1 5/2013

OTHER PUBLICATIONS

Holland Shielding, "101 EMI Shielding Tips and Tricks," 16 pages, accessed Apr. 12, 2021. https://hollandshielding.com/Shielding-tips-and-tricks.
International Search Report and Written Opinion for International Application No. PCT/CN2021/089750, dated Jan. 26, 2022, 8 pages.
Wikipedia, Electromagnetic Shielding, 6 pages, Accessed Apr. 12 2021.

* cited by examiner

BUILDING CONTROLLER WITH LATERAL SIDE SHIELDING

TECHNICAL FIELD

The present disclosure relates generally to building controllers. More particularly, the present disclosure relates to methods and devices for electromagnetic shielding within building controllers, such as Heating, Ventilation, and/or Air Conditioning (HVAC) controllers.

BACKGROUND

Building controllers are used to control one or more building control components of a building control system. Such building control systems can include Heating, Ventilation, and/or Air Conditioning (HVAC) systems, building security systems, building lighting control systems, and/or any other suitable building control system. The building controller may include electronic components that generate unwanted noise, (e.g., electrical currents and/or voltages) that may cause electromagnetic interference (EMI). Such EMI may cause performance degradation of other nearby components such as, for example, an antenna of the building controller. In some cases, EMI generated by devices external to a building controller (e.g. a cell phones, wireless transmitters, lightening, utility power grid transmission lines, household appliances such as microwave ovens, transformers, CRT monitors or televisions, etc.) can cause performance degradation of some internal components of the building controller under certain conditions. Thus, there is a desire for improved building controllers that are configured to contain, control and/or isolate unwanted noise (e.g., EMI).

SUMMARY

The present disclosure relates generally to building controllers. More particularly, the present disclosure relates to building controllers, such as a Heating, Ventilation, and/or Air Conditioning (HVAC) controllers, with improved EMI shielding to help contain, control and/or isolate unwanted noise (e.g., EMI). In an example, a thermostat may include a display having a metal backing, a printed circuit board having a ground plane, and one or more electrical components mounted to the printed circuit board. The one or more electrical components may be mounted in a shielded region on the printed circuit board and between the ground plane of the printed circuit board and the metal backing of the display. One or more conductive side shield elements are positioned between the printed circuit board and the display and extend along at least part of at least two lateral sides of the shielded region of the printed circuit board. The one or more conductive side shield elements may be electrically connected to the ground plane of the printed circuit board and may provide a side shield that reduces at least some EMI generated by the one or more electrical components situated in the shielded region of the printed circuit board from escaping laterally out from between the ground plane of the printed circuit board and the metal backing of the display. The one or more conductive side shield elements may also help reduce at least some EMI generated external to the shielded region from entering laterally into the shielded region from between the ground plane of the printed circuit board and the metal backing of the display.

In another example, a thermostat may include a display having a metal backing, a printed circuit board having a ground plane, and a processor and/or memory mounted to the printed circuit board. The processor and/or memory may be mounted in a shielded region on the printed circuit board and between the ground plane of the printed circuit board and the metal backing of the display. The thermostat may include one or more conductive side shield elements positioned between the printed circuit board and the display and may extend along at least part of at least two lateral sides of the shielded region of the printed circuit board. The one or more conductive side shield elements may be electrically connected to the ground plane of the printed circuit board and may provide a side shield that reduces at least some Electro-Magnetic Interference (EMI) generated by the processor and/or memory situated in the shielded region of the printed circuit board from escaping laterally out from between the ground plane of the printed circuit board and the metal backing of the display.

An antenna may be operatively coupled to the printed circuit board and may be outside of and laterally spaced from the shielded region along one of the at least two lateral sides of the shielded region. The side shield may reduce at least some Electro-Magnetic Interference (EMI) that is generated by the processor and/or memory from reaching the antenna.

In another example, a thermostat may include a display having a metal backing, a printed circuit board having a ground plane, and a processor and/or memory mounted to the printed circuit board. The processor and/or memory may be mounted in a shielded region on the printed circuit board and between the ground plane of the printed circuit board and the metal backing of the display. The thermostat may include one or more conductive side shield elements positioned between the printed circuit board and the display and may extend along at least part of at least three lateral sides of the shielded region of the printed circuit board. The one or more conductive side shield elements may be electrically connected to the ground plane of the printed circuit board and may provide a side shield that reduces at least some Electro-Magnetic Interference (EMI) generated by the processor and/or memory situated in the shielded region of the printed circuit board from escaping laterally out from between the ground plane of the printed circuit board and the metal backing of the display. An antenna may be operatively coupled to the printed circuit board and laterally spaced from the shielded region along one of the at least three lateral sides of the shielded region.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which.

Figure 1:
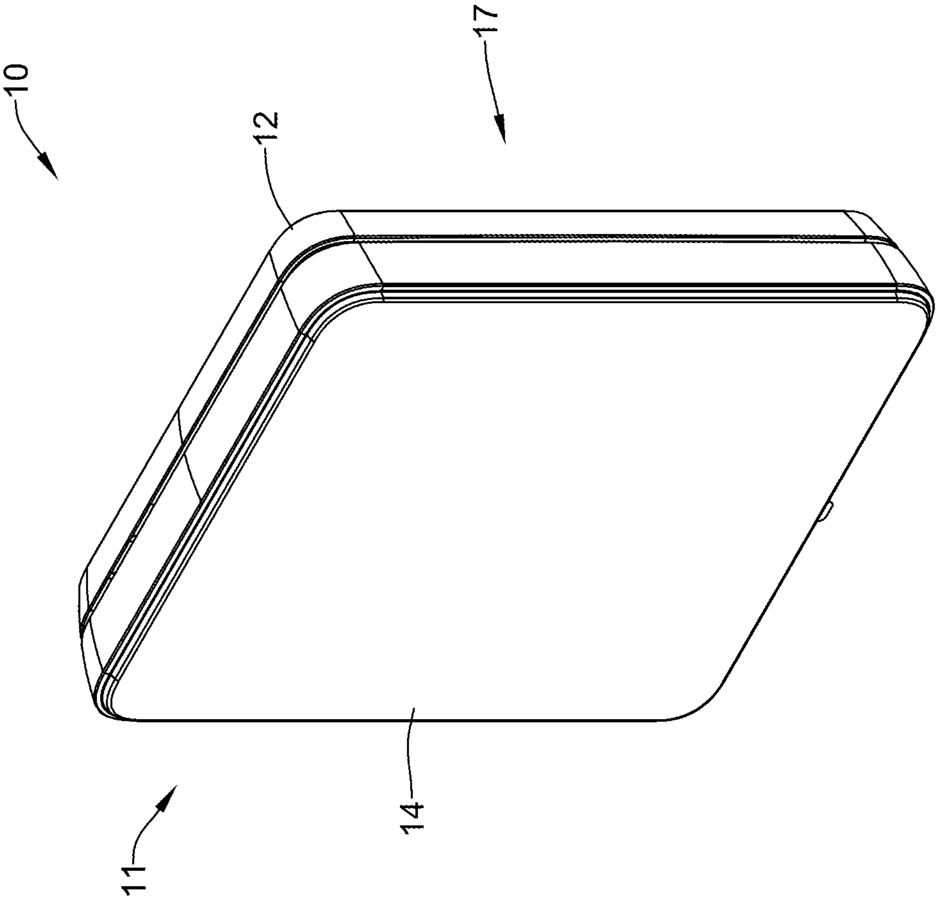
FIG. 1 is a schematic perspective view of an illustrative HVAC controller.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranged by endpoints includes all numbers subsumed within that range (e.g., 1 to 5 includes, 1, 1.5, 2, 2.75, 3, 3.8, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

The present disclosure relates generally to building controllers. More particularly, the present disclosure relates to methods and devices for electromagnetic shielding within building controllers, such as Heating, Ventilation, and/or Air Conditioning (HVAC) controllers. While HVAC controllers are used as an example below, it should be recognized that the concepts disclosed herein can be applied to building control systems more generally.

Building controllers, such as the illustrative HVAC controller 10 shown in FIGS. 1-8, may contain electrical components that may be susceptible to Electro-Magnetic Interference (EMI). EMI may decrease performance of one or more of the electrical components (e.g., antenna 16) of the building controller. Providing some level of EMI shielding is desirable in many situations.

FIG. 1 is a schematic perspective view of an illustrative HVAC controller 10. The HVAC controller 10 may be part of an HVAC system, which may be configured to control various components of an HVAC system. While an HVAC controller is used as an example, it is contemplated that the teachings disclosed herein may be applied to any suitable building suitable controller.

In some cases, the illustrative HVAC controller 10 may be a thermostat. The HVAC controller 10 may be configured to communicate with various components of the HVAC system via a wired link (not shown). In some cases, the HVAC controller 10 may be configured to communicate with the various components of the HVAC system via a wireless link (not shown). In some cases, the HVAC controller 10 may communicate over one or more wired or wireless networks that may accommodate remote access and/or control of the HVAC components via another device such as a smart phone, tablet, e-reader, laptop computer, personal computer, key fob, or the like. In some cases, the HVAC controller 10 may include a first communications port for communicating over a first network, and in some cases, a second communications port for communicating over a second network. In some cases, the first network may be a wireless local area network (WLAN), and the second network (when provided) may be a wide area network or a global network (WAN) including, for example, the Internet. In some cases, the remote devices may be configured to communicate wirelessly over the first network and/or the second network with the HVAC controller 10 via one or more wireless communication protocols including, but not limited to, cellular communication, ZigBee, REDLINK™, Bluetooth, WiFi, IrDA, dedicated short range communication (DSRC), EnOcean, and/or any other suitable common or proprietary wireless protocol, as desired.

Figure 5:
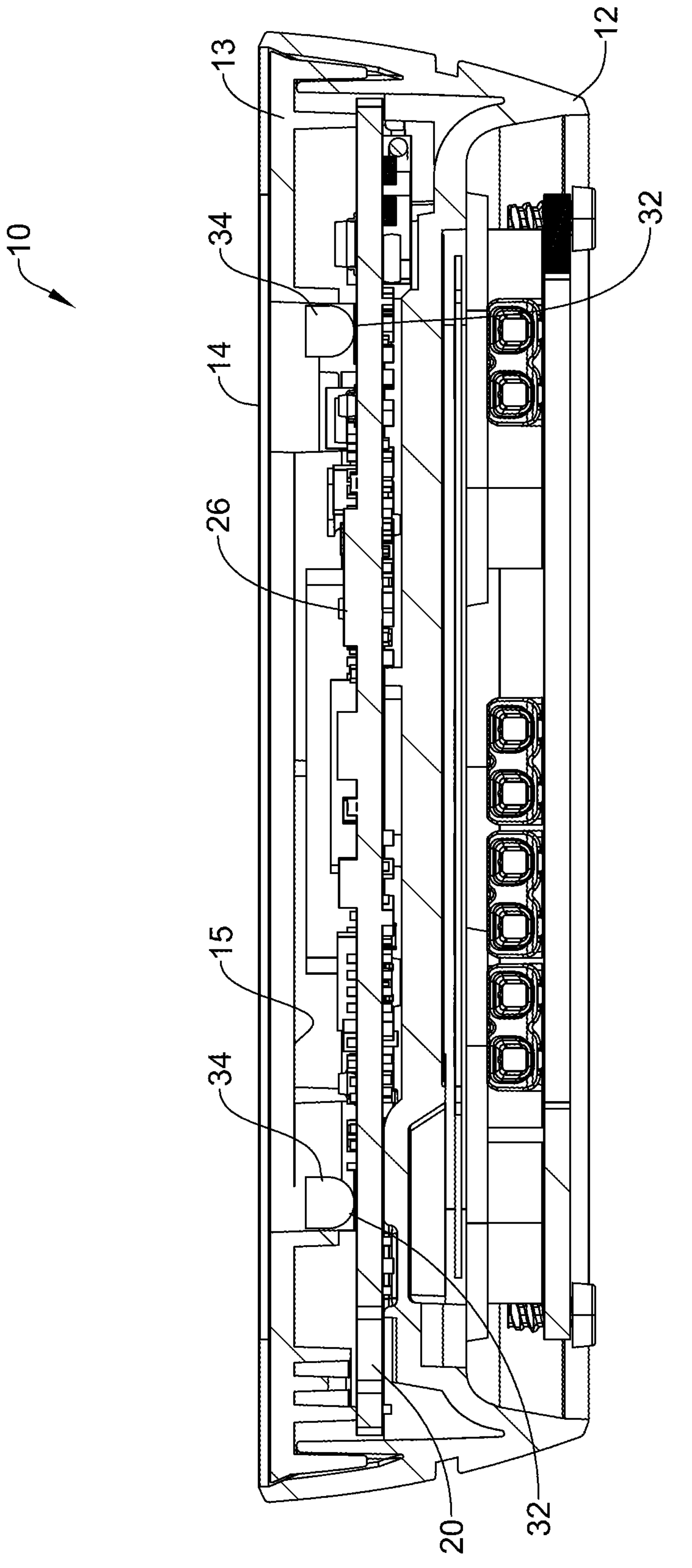
FIG. 5 is a schematic cross-section view of the illustrative HVAC controller of FIG. 4, taken at line 5-5.
Figure 7:
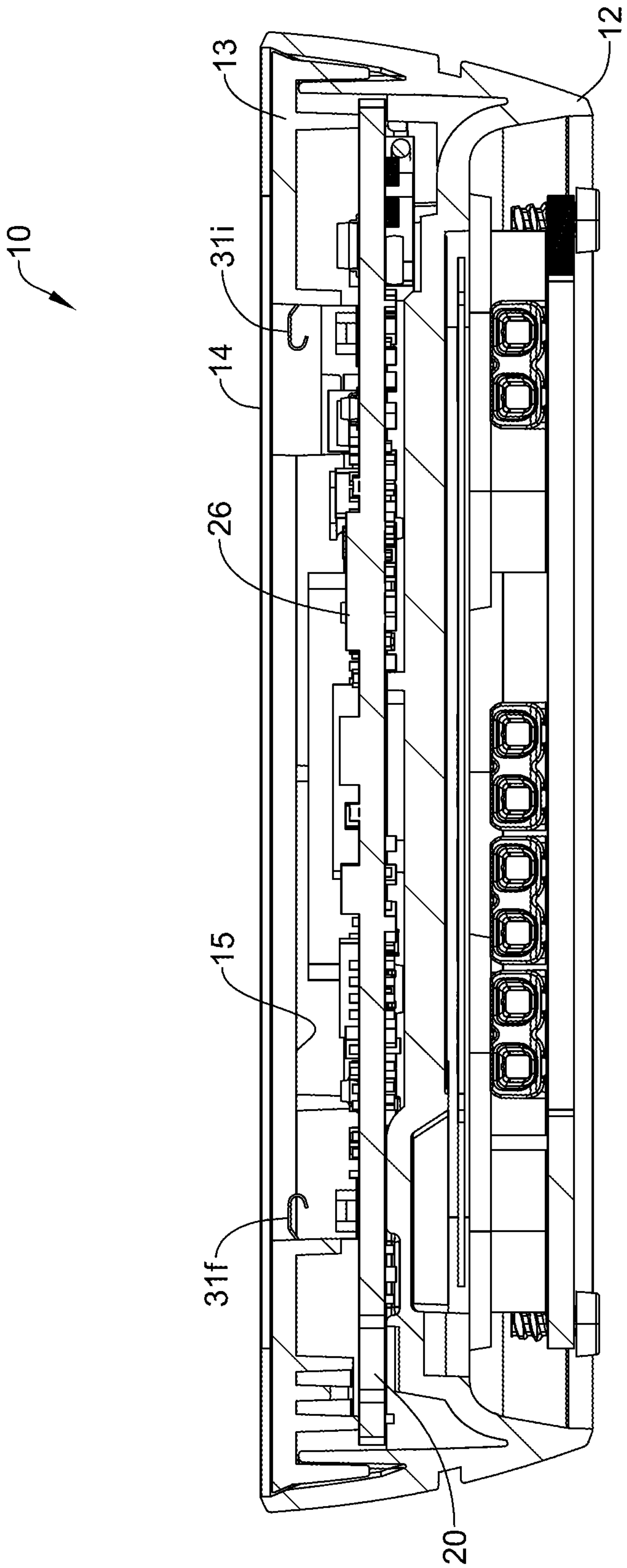
FIG. 7 is a schematic cross-section view of the illustrative HVAC controller of FIG. 7, taken at line 7-7.

In some instances, as shown in FIG. 1, the HVAC controller 10 may include a housing 12 having a front side 11 and a back side 17, and a display 14. The display 14 may be a fixed segment Liquid Crystal Display (LCD), a dot matrix display or any other suitable display. In some cases, as shown in FIG. 1, the display 14 may form the front side 11 of the housing 12. In some cases, the display 14 may form a portion of the front side 11 of the housing 12. In some cases, the display 14 may be a touch screen display, but this is not required. The display 14 may include a metal backing 15 (as shown in FIGS. 5 and 7) on a back side (e.g., a side opposite the viewing side) of the display 14. The metal backing 15 (e.g., a zinc plating, sheet metal, and/or other metal or conductive material), may include a portion of a backing that is metal, or a metal feature extending adjacent the back of the display 14. While a metal backing is used in this example, it is contemplated that any suitable conductive layer or shield may be used, as desired. The display 14 may be configured to be held within the housing 12 via a display holder 13 as shown in FIG. 2, but this is not required.

Figure 2:
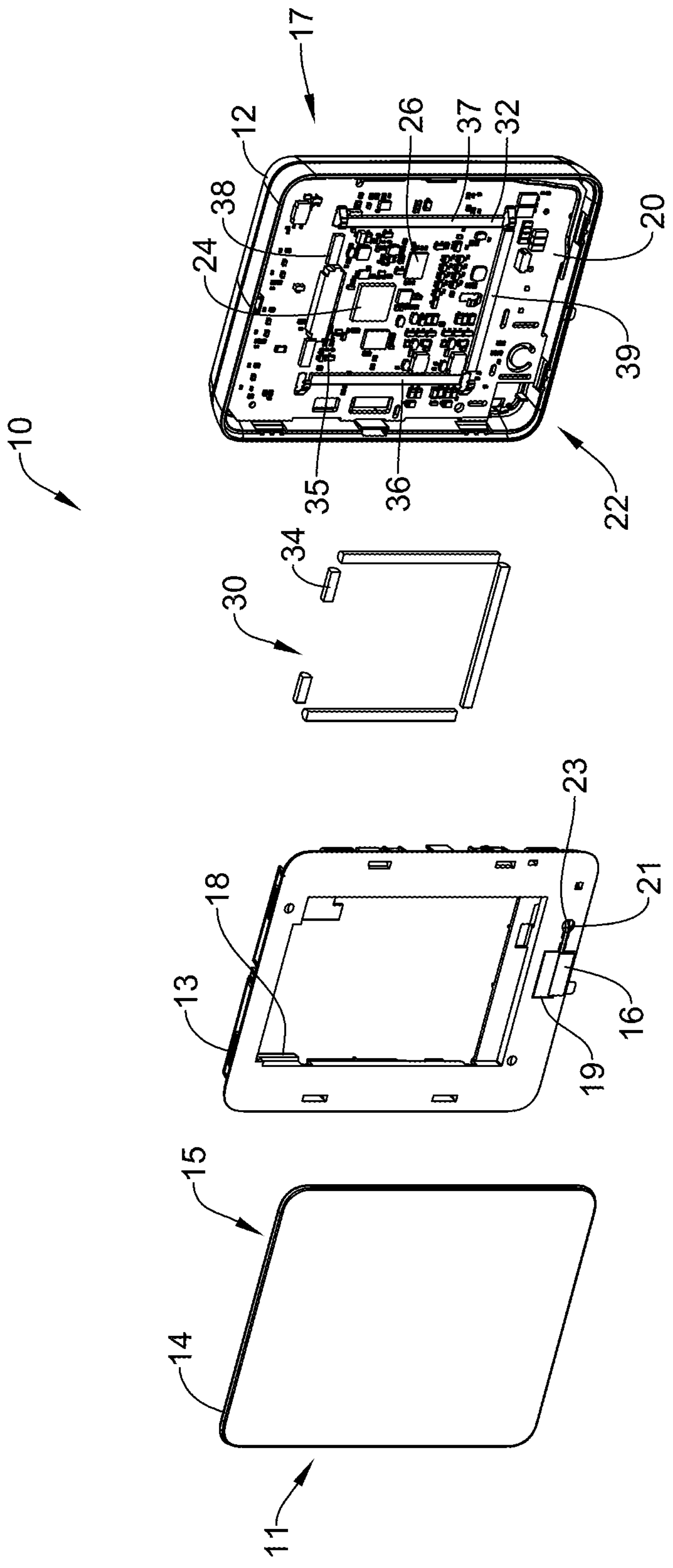
FIG. 2 is a schematic exploded view of the illustrative HVAC controller of FIG. 1.
Figure 3:
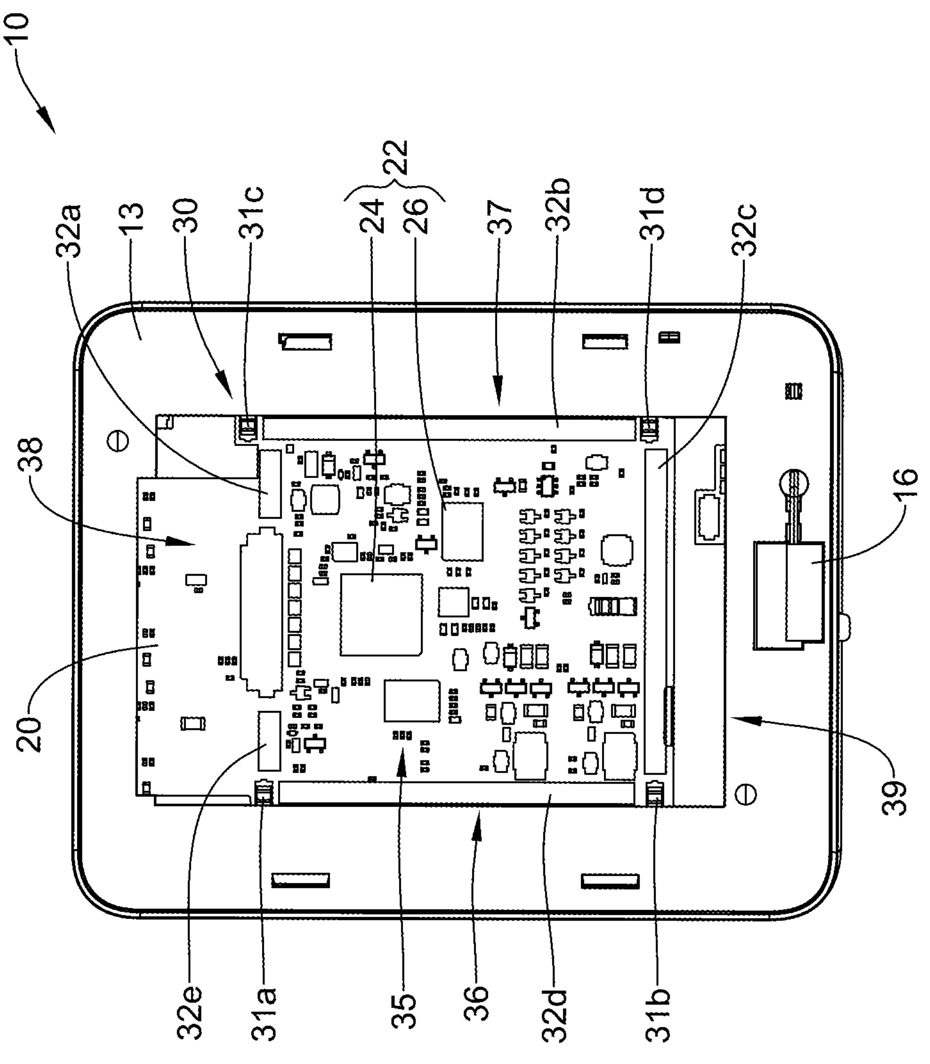
FIG. 3 is a schematic front view of an example embodiment of the illustrative HVAC controller of FIG. 1 with the display and one or more conductive side shield elements removed.

FIG. 2 is a schematic exploded view of the illustrative HVAC controller 10 of FIG. 1. As discussed with reference to FIG. 1, the HVAC controller 10 may include the housing 12 and the display 14. The display 14 may include the metal backing 15, which may function as a conductive shield. The display 14 may be configured to be held within the housing 12 via the display holder 13. The display holder 13, which may also be considered as an intermediate structure of the housing 12, may include a display recess 18 that may be considered as accommodating at least part of the display 14. In some cases, the display 14 may be configured to be affixed to the housing 12 via the display holder 13. The display 14 may be affixed to the display holder 13 via a snap-fit connection, one or more screws, double-faced tape, or any other mechanism to physically secure the display 14 to the display holder 13.

In some cases, the display holder 13 may include an antenna recess 19 that is configured to accommodate at least a portion of an antenna 16. The antenna 16 may be operatively coupled to the PCB 20. In some cases, the antenna recess 19 may include an aperture 23 that permits the antenna 16 to pass through the display holder 13. In some cases, the antenna 16 may be considered as a flexible printed circuit (FPC) that fits at least partially into the antenna recess 19 and includes a connector cable 21 that extends from the antenna 16 and passes through a cable aperture 23 such that the connector cable 21 is able to be electrically connected to a connector on a printed circuit board (PCB) 20. The antenna 16 may be configured such that it is positioned within the antenna recess 19 which may be between the display 14 and the display holder 13. In some cases, the display 14 and/or metal backing layer 15 of the display 14 do not extend laterally to overlap with the antenna 16.

In some cases, the PCB 20 may include a grounding feature, such as a ground plane. In some cases, the ground plane may be a conductive layer of the PCB 20 connected to a grounding point of the PCB 20. The ground plane may serve as a return path for current from electrical components 22, such as a processor 24 or a memory 26, for example. In some cases, the ground plane extends laterally to cover most of the PCB 20. However, in some cases, the ground plane may not extend laterally to overlap with the antenna 16. In some cases, the ground plane may include one or more holes to accommodate feed throughs that allow signals to pass between layers of the PCB 20 without electrically contacting the ground plane.

In some cases, the PCB 20 may include one or more electrical components 22 mounted to the PCB 20 within and outside of a shielded region 35 on the PCB 20. The one or more electrical components 22 may include a memory (e.g., memory 26), a processor (e.g., processor 24), one or more sensors (e.g., a temperature sensor, a humidity sensor, an occupancy sensor, or the like), a microcontroller unit (MCU), and/or any other suitable components. The shielded region 35 may be positioned between the ground plane of the PCB 20 and the metal backing 15 of the display 14. The ground plane of the PCB 20 and the metal backing 15 of the display 14 provide a level of EMI shielding to the front and back of the shielded region 35.

As can be seen, the illustrative shielded region 35 include four lateral sides including a left side 36, a right side 37, a top side 38, and a bottom side 39. While the shielded region 35 is described as having four lateral sides, it may be considered that the shielded region 35 may include a different number of lateral sides, sometimes depending on the shape. One or more conductive side shield elements 30 are positioned between the PCB 20 and the display 14, and extend along at least part of at least two lateral sides of the shielded region 35. In some cases, the one or more conductive side shield elements 30 may be positioned along at least part of two opposing sides of the shielded region 35. In some cases, the one or more conductive side shield elements 30 may be positions along at least three sides of the shielded region 35. In other cases, the one or more conductive side shield elements 30 may be positioned along at least four sides of the shielded region 35. The one or more conductive side shield elements 30 may be electrically connected to the ground plane of the PCB 20 such that the conductive side shield elements 30 provide a side shield that reduces at least some EMI generated by the one or more electrical components 22 situated within the shielded region 35 of the PCB 20 from escaping laterally out from between the ground plane of the PCB 20 and the metal backing 15, and/or prevents at least some externally generated EMI from laterally entering the shielded region 35.

The one or more conductive side shield elements 30 may be configured to extend from the PCB 20 through the display recess 18 of the display holder 13 and may electrically connect the ground plane of the PCB 20 and the metal backing 15 of the display 14. In some cases, the one or more conductive side shield elements 30 may have a height of 1.5 millimeters (mm), 2.5 mm, 3.5 mm, or any other suitable height. In some cases, the one or more conductive side shield elements 30 may have a height sufficient to physically engage both the PCB 20 and the display 14. In some cases, the one or more conductive side shield elements 30 may be bonded to the PCB 20 (e.g. via an adhesive, solder, clipped or the like). In other cases, the one or more conductive side shield elements 30 may be bonded to the metal backing 15 of the display 14. In some cases, a first portion of the conductive side shield elements 30 may be bonded to the PCB 20 and a second portion may be bonded to the metal backing 15 of the display 14, and the first and second portions may engage one another during assembly of the thermostat 10.

The one or more conductive side shield elements 30 may include for example, but not limited to, one or more conductive springs 31 (as shown in FIGS. 3, 4, and 6-8) which may be spaced apart from one another, and/or one or more conductive gaskets 34. When used, the one or more conductive gaskets 34 may include a conductive foam, a conductive paper, a conductive fabric over foam, or the like. The one or more conductive gaskets 34 may be elongated and may be positioned between the PCB 20 and the metal backing 15 of the display 14, and may form an elongated conductive sidewall of the shielded region 35. In some cases, the elongated conductive gasket(s) 34 may extend along at least 10 percent of each of at least two lateral sides of the shielded region 25, at least 20 percent of each of at least two lateral sides of the shielded region 25, at least 40 percent of each of at least two lateral sides of the shielded region 25, at least 50 percent of each of at least two lateral sides of the shielded region 25, at least 75 percent of each of at least two lateral sides of the shielded region 25, at least 80 percent of each of at least two lateral sides of the shielded region 25, at least 90 percent of each of at least two lateral sides of the shielded region 25, 100 percent of each of at least two lateral sides of the shielded region 25, and/or any other suitable percentage.

In some cases, one or more conductive contacts 32 (e.g. see FIGS. 3, 5) may be positioned between the PCB 20 and the one or more conductive side shield elements 30 (e.g. conductive gaskets 34), and may be electrically connected to the ground plane of the PCB 20 and the one or more conductive side shield elements 30. For example, when the one or more conductive gaskets 34 are included in the HVAC controller 10, the one or more conductive contacts **32*a*-32*e* may be configured to be the size and shape of the one or more conductive gaskets 34 (see FIG. 3), or may just include one or more conductive pads exposed on the front side of the PCB 20 to make an electrical contact with the one or more conductive gaskets 34**.

The one or more conductive side shield elements 30 may be configured to providing EMI shielding to the shielded region 35. The shielded region 35 may include one or more of the electrical components 22 (e.g., the processor 24, the memory 26) within. In some cases, the electrical components 22, such as the processor 24 and/or the memory 26, may operate at a frequency of greater than 50 megahertz (MHz) and/or may have an output rise time of less than 10 nanoseconds (ns). In some cases, the electrical components 22 may operate at a frequency of 2.4 gigahertz (GHz) or greater and/or may have an output rise time of less than 10 ns. In some cases, the electrical components 22 may operate at a frequency of 10 MHz or greater. These are just examples. The frequency that the electrical components 22 operate may create different noise in the form of an Electro-Magnetic Interference (EMI), which may interfere with the operation of other components of the HVAC controller 10, such as, for example, the antenna 16. When the electrical components 22 are provided within the shielded region 35, the shielded region 35 may reduce the noise (e.g., EMI) created by the electrical components 22 that are within the shielded region 35 from escaping laterally out from between the ground plane of the PCB 20 and the metal backing 15 of the display 14. In some cases, as shown in FIGS. 3, 4, 6, and 8, the antenna 16 may be laterally spaced from the shielded region 35 along one of the lateral sides (e.g., the left side 36, the right side 37, the top side 38, the bottom side 39) of the shielded region 35, such that one or more conductive side shield elements 30 are configured to provide a side shield extending between the antenna 16 and the electrical components 22 that create the undesirable EMI noise.

Figure 4:
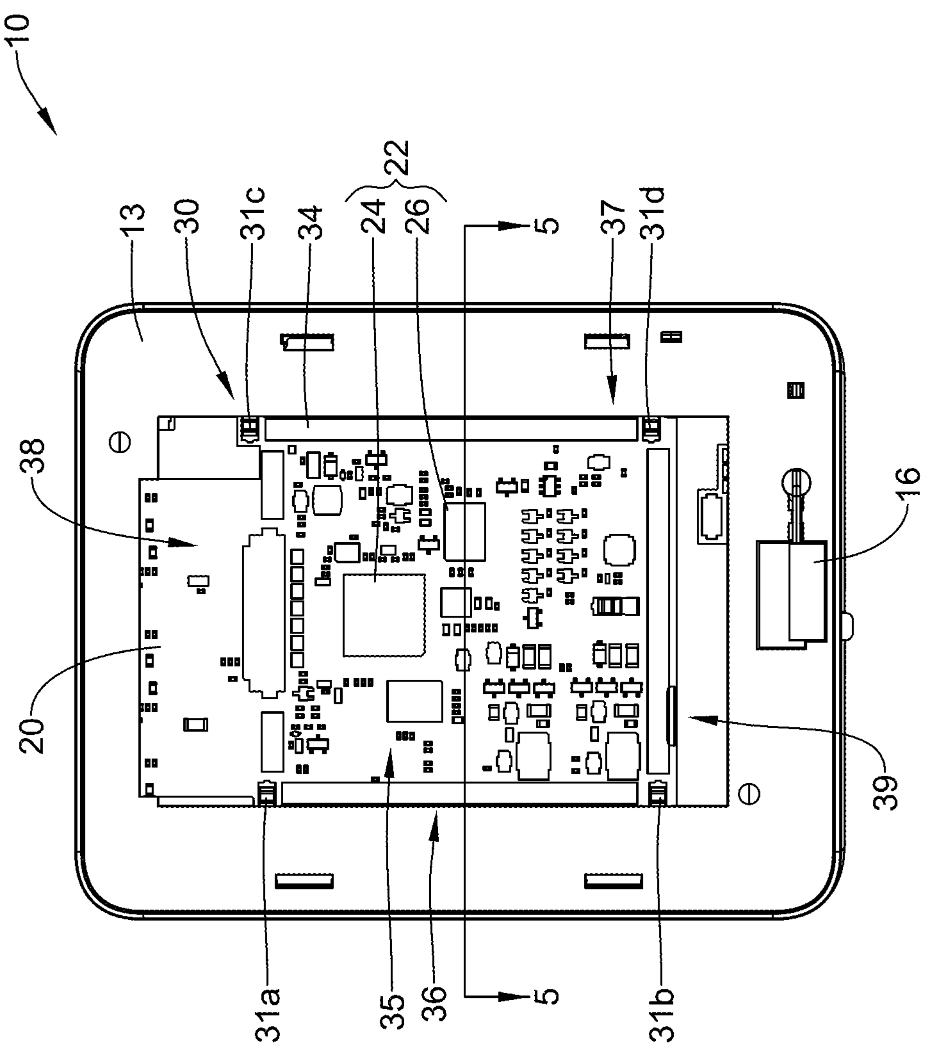
FIG. 4 is a schematic front view of an example embodiment of the illustrative HVAC controller of FIG. 1 with the display removed and with elongated conductive gaskets defining the shielded region.

FIG. 4 is a schematic front view of an example embodiment of the illustrative HVAC controller 10 of FIG. 1 with the display 14 removed and with elongated conductive gaskets 34 defining the shielded region 35. FIG. 5 is a schematic cross-section view of the illustrative HVAC controller 10 of FIG. 4, taken at line 5-5. The example shown in FIGS. 4 and 5 includes the one or more conductive side shield elements 30 that include one or more conductive springs 31 and the one or more conductive gaskets 34. The one or more conductive springs 31 and the one or more conductive gaskets 34 together may form the shielded region 35.

As shown in FIG. 4, the antenna 16 may be laterally spaced apart from shielded region 35 formed by the one or more conductive springs 31 and the one or more conductive gaskets 34. The one or more conductive springs 31 and the one or more conductive gaskets 34 may reduce at least some of the EMI generated by the one or more electrical components 22 (e.g., the processor 24 and/or the memory 26) from escaping laterally out from the PCB 20, thereby enhancing the performance of the antenna 16.

As shown in FIG. 5, the one or more conductive contacts 32 may be positioned between the one or more conductive gaskets 34 and the PCB 20. The one or more conductive contacts 32 may be electrically connected to the ground plane of the PCB 20 and make electrical contact with the one or more conductive gaskets 34. The one or more conductive gaskets 34 may be configured to extend from the PCB 20 through the display recess 18 of the display holder 13 and mechanically and electrically connect the ground plane of the PCB 20 and the metal backing 15 of the display 14.

Figure 6:
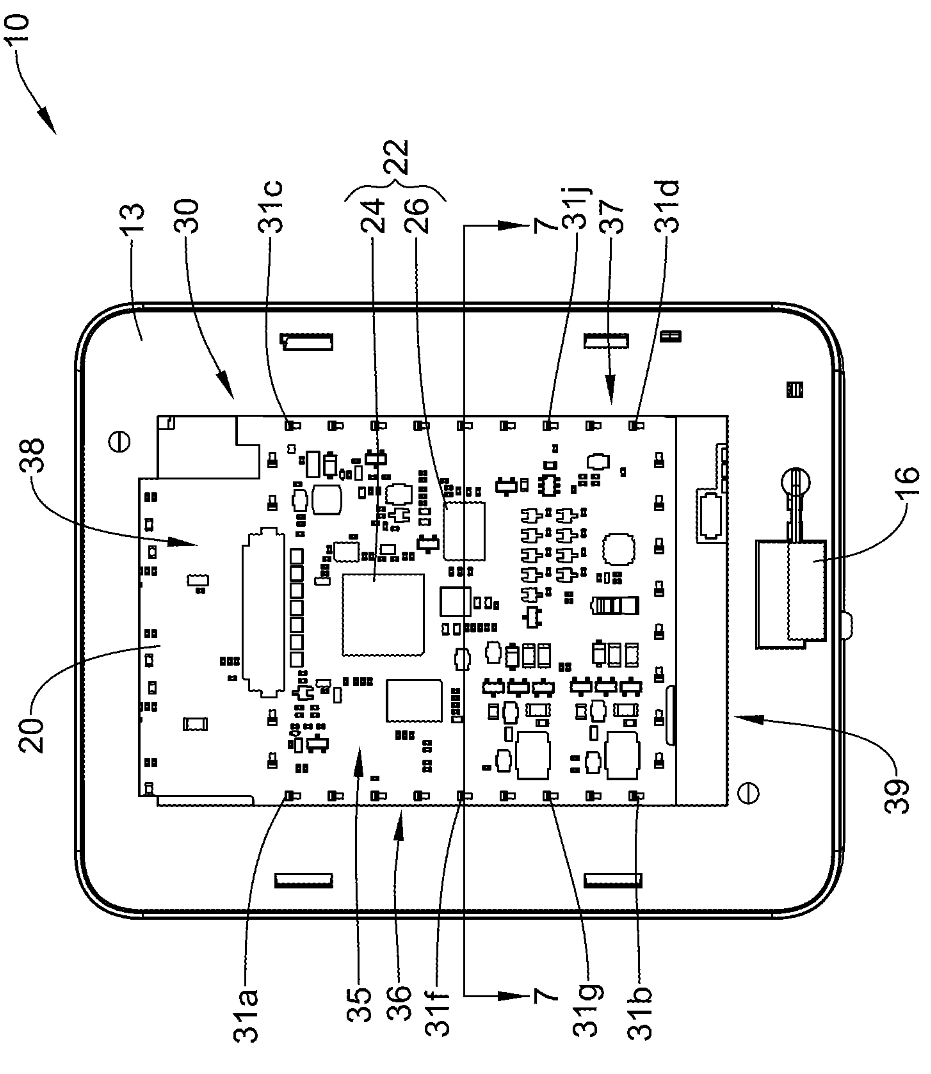
FIG. 6 is a schematic front view of an example embodiment of the illustrative HVAC controller of FIG. 1 with the display removed and with a plurality of spaced conductive springs defining the shielded region rather than the elongated conductive gaskets shown in FIG. 4.

FIG. 6 is a schematic front view of an example embodiment of the illustrative HVAC controller 10 of FIG. 1 with the display 14 removed and with a plurality of spaced conductive springs 31 defining the shielded region 35 rather than the elongated conductive gaskets 34 shown in FIG. 4. FIG. 7 is a schematic cross-section view of the illustrative HVAC controller of FIG. 7, taken at line 7-7. The example shown in FIGS. 6 and 7 includes the one or more conductive side shield elements 30 that include a plurality of spaced conductive springs 31*a*, 31*b*, 31*c*, 31*d*, 31*e*, 31*f*, 31*g*, 31*h*, 31*i*, and 31*j* (collectively referred to as conductive springs 31). While the HVAC controller 10 shown in FIG. 6 includes 10 conductive springs, 31, it is contemplated that the HVAC controller 10 may include more or less conductive springs including 10 conductive springs, 20 conductive springs, 30 conductive springs, 70 conductive springs, or any other suitable number of conductive springs, as desired. It is contemplated that the conductive springs may be placed along the left, right, button and top sides of the shielded region 35, and/or along just one or more of these sides as desired.

The spacing of the conductive springs 31 may be dependent on the frequency of the unwanted EMI. For example, the spacing between the conductive springs 31 may be less for lower frequency unwanted EMI, and may be greater for higher frequency EMI. As such, by knowing the frequencies of the unwanted EMI (e.g. operating frequency of the processor, memory and/or other EMI emitting components on the PCB 20), the spacing between the conductive springs 31 may be identified and set. In some cases, the conductive springs 31 may be spaced less than 5 mm apart, between 5 mm and 10 mm apart, between 10 mm and 20 mm apart, between 20 mm and 30 mm apart, between 30 mm and 50 mm apart, greater than 50 mm apart, and or any other suitable spacing.

As shown in FIG. 6, the antenna 16 may be laterally spaced apart from shielded region 35 formed by the one or more conductive springs 31. The one or more conductive springs 31 reduce at least some of the EMI generated by the one or more electrical components 22 (e.g., the processor 24 and/or the memory 26) from escaping laterally out from the PCB 20 and to the antenna 16, thereby enhancing the performance of the antenna 16. As shown in FIG. 7, each of the one or more conductive springs 31 may be configured to extend from the PCB 20 through the display recess 18 of the display holder 13, and may be biased to mechanically engage and electrically connect the ground plane of the PCB 20 and the metal backing 15 of the display 14.

Figure 8:
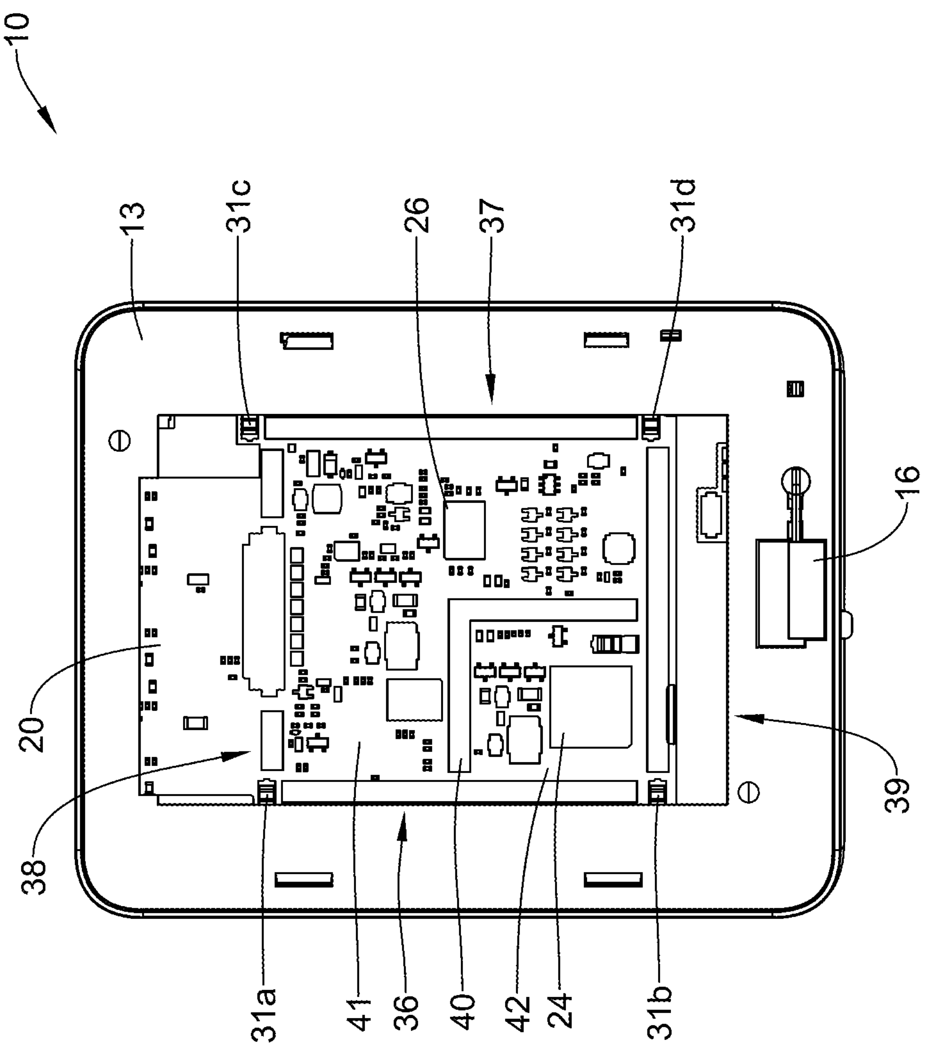
FIG. 8 a schematic front view of an example embodiment of the illustrative HVAC controller of FIG. 1 with the display removed and with elongated conductive gaskets defining a shielded region with two shielded sub-regions.

FIG. 8 a schematic front view of an example embodiment of the illustrative HVAC controller 10 of FIG. 1 with the display 14 removed and with elongated conductive gaskets 34 defining a shielded region 35 with two shielded sub-regions. As shown in FIG. 8, the shielded region 35 includes a first sub-region 41 and a second sub-region 42, which are separated by a sub-region boundary 40 formed by a conductive gasket. Each sub-region may include one or more electrical components 22. In some cases, as shown in FIG. 8, the first sub-region 41 may include the memory 26 and the second sub-region 42 may include the processor 24. This is just an example. It may be contemplated that any of the electrical components 22 may be included in either the first sub-region 41 or the second sub-region 42.

The sub-region boundary 40 may include the one or more conductive side shield elements 30 positioned along at least part of the sub-region boundary 40. For example, as shown in FIG. 8, the one or more conductive side shield elements 30 may include the one or more conductive gaskets 34 along the lateral sides of the shielded region 35 as well as along a portion of the sub-region boundary 40. In some cases, it is contemplated that one or more conductive springs 31 may be positioned along at least part of the sub-region boundary 40 and/or around the perimeter of the shielded region 35.

The sub-region boundary 40 may serve to reduce at least some of the EMI generated by the one or more electrical components 22 (e.g., the processor 24 and/or the memory 26) from escaping laterally out from the PCB 20 and engaging other components in another sub-region. For example, if the processor 24 operates at a frequency of 50 MHz, the one or more conductive side shield elements 30 of the sub-region boundary 40 help contain the EMI produced by the processor 24 within the second sub-region 42, thereby reducing interference with and/or degradation of the operation of the memory 26, the antenna 16, and/or any other electrical components 22 outside of the second sub-region 42.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A thermostat comprising:

a display having a metal backing;

a printed circuit board having a ground plane;

one or more electrical components mounted to the printed circuit board, the one or electrical components mounted in a shielded region on the printed circuit board and between the ground plane of the printed circuit board and the metal backing of the display; and, one or more conductive side shield elements positioned between the printed circuit board and the display and extending along at least part of at least two lateral sides of the shielded region of the printed circuit board, the one or more conductive side shield elements electrically connected to the ground plane of the printed circuit board and providing a side shield that reduces at least some Electro-Magnetic Interference (EMI) generated by the one or more electrical components situated in the shielded region of the printed circuit board from escaping laterally out from between the ground plane of the printed circuit board and the metal backing of the display, wherein the one or more conductive side shield elements comprise one or more conductive springs.

2. The thermostat of claim 1, wherein the one or more conductive side shield elements electrically connect the ground plane of the printed circuit board and the metal backing of the display.

3. The thermostat of claim 1, wherein the one or more conductive side shield elements are bonded to the printed circuit board.

4. The thermostat of claim 1, wherein the one or more conductive side shield elements are bonded to the display.

5. The thermostat of claim 1, wherein the printed circuit board comprises one or more conductive contacts that are electrically connected to the ground plane of the printed circuit board, wherein the one or more conductive contacts of the printed circuit board make electrical contact with the one or more conductive side shield elements.

6. The thermostat of claim 1, wherein the shielded region has a left side, a right side, a top side and a bottom side, and wherein the one or more conductive side shield elements are positioned along at least part of two opposing sides of the shielded region.

7. The thermostat of claim 6, wherein the one or more conductive side shield elements are positioned along at least three sides of the shielded region.

8. The thermostat of claim 6, wherein the one or more conductive side shield elements are positioned along at least four sides of the shielded region.

9. The thermostat of claim 1, wherein the one or more conductive side shield elements comprise a plurality of conductive side shield elements spaced from one another.

10. The thermostat of claim 1, wherein the one or more conductive side shield elements comprise one or more elongated conductive gaskets that are positioned between the printed circuit board and the metal backing of the display and extend along at least 25 percent of the at least two lateral sides of the shielded region of the printed circuit board.

11. The thermostat of claim 10, wherein the one or more elongated conductive gaskets comprise a conductive foam.

12. The thermostat of claim 1 further comprising an antenna that is laterally spaced from the shielded region, wherein one or more of the conductive side shield elements are positioned between the antenna and the shielded region.

13. The thermostat of claim 1, wherein the shielded region comprises a first sub-region and a second sub-region separated a sub-region boundary, with each sub-region having one or more electrical components, and wherein one or more of the conductive side shield elements are positioned along at least part of the sub-region boundary.

14. The thermostat of claim 1, wherein the one or more electrical components comprises a processor and/or a memory that operates at a frequency of greater than 50 MHz and/or has an output rise time of less than 10 ns.

15. The thermostat of claim 1, the one or more conductive side shield elements further comprise one or more elongated conductive gaskets, wherein the conductive springs are structurally spaced away from the one or more conductive gaskets, the springs and gaskets together being configured to reduce at least some of the EMI generated by the one or more electrical components situated in the shielded region of the printed circuit board from escaping laterally out from between the ground plane of the printed circuit board and the metal backing of the display.

16. A thermostat comprising:

a display having a metal backing;

a printed circuit board having a ground plane;

a processor and/or memory mounted to the printed circuit board, the processor and/or memory mounted in a shielded region on the printed circuit board and between the ground plane of the printed circuit board and the metal backing of the display;

one or more conductive side shield elements positioned between the printed circuit board and the display and extending along at least part of at least two lateral sides of the shielded region of the printed circuit board, the one or more conductive side shield elements electrically connected to the ground plane of the printed circuit board and providing a side shield that reduces at least some Electro-Magnetic Interference (EMI) generated by the processor and/or memory situated in the shielded region of the printed circuit board from escaping laterally out from between the ground plane of the printed circuit board and the metal backing of the display, wherein the one or more conductive side shield elements comprise one or more conductive springs; and, an antenna operatively coupled to the printed circuit board and laterally spaced from the shielded region along one of the at least two lateral sides of the shielded region.

17. The thermostat of claim 16, wherein the processor and/or memory operates at a frequency of greater than 50 MHz and/or has an output rise time of less than 10 ns.

18. The thermostat of claim 16, wherein the one or more conductive side shield elements further comprise one or more elongated conductive gaskets that are positioned between the printed circuit board and the metal backing of the display.

19. A thermostat comprising:

a display having a metal backing;

a printed circuit board having a ground plane;

a processor and/or memory mounted to the printed circuit board, the processor and/or memory mounted in a shielded region on the printed circuit board and between the ground plane of the printed circuit board and the metal backing of the display;

one or more conductive side shield elements positioned between the printed circuit board and the display and extending along at least part of at least three lateral sides of the shielded region of the printed circuit board, the one or more conductive side shield elements electrically connected to the ground plane of the printed circuit board and providing a side shield that reduces at least some Electro-Magnetic Interference (EMI) generated by the processor and/or memory situated in the shielded region of the printed circuit board from escaping laterally out from between the ground plane of the printed circuit board and the metal backing of the display, wherein the one or more conductive side shield elements comprise one or more conductive springs; and, an antenna operatively coupled to the printed circuit board and laterally spaced from the shielded region along one of the at least three lateral sides of the shielded region.

20. The thermostat of claim 19, wherein the one or more conductive side shield elements further comprise one or more elongated conductive gaskets that are positioned between the printed circuit board and the metal backing of the display.

* * * * *